(12) United States Patent
Li

(10) Patent No.: US 7,576,399 B2
(45) Date of Patent: Aug. 18, 2009

(54) SEMICONDUCTOR DEVICE AND METHOD OF MANUFACTURE THEREOF

(75) Inventor: Hong-Jyh Li, Austin, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/866,887

(22) Filed: Oct. 3, 2007

(65) Prior Publication Data

US 2008/0023777 A1 Jan. 31, 2008

Related U.S. Application Data

(62) Division of application No. 11/005,385, filed on Dec. 6, 2004, now Pat. No. 7,291,526.

(51) Int. Cl.
*H01L 29/78* (2006.01)
(52) U.S. Cl. ................ 257/412; 257/288; 257/E29.125
(58) Field of Classification Search ................ 257/288, 257/324, 407, 410, 412
See application file for complete search history.

(56) References Cited

U.S. PATENT DOCUMENTS

| | | | | |
|---|---|---|---|---|
| 6,013,553 | A | * | 1/2000 | Wallace et al. ............ 438/287 |
| 6,184,072 | B1 | | 2/2001 | Kaushik et al. |
| 7,279,413 | B2 | * | 10/2007 | Park et al. .................. 438/627 |
| 2004/0014306 | A1 | | 1/2004 | Komatsu |
| 2004/0214400 | A1 | | 10/2004 | Muraoka et al. |
| 2005/0145893 | A1 | | 7/2005 | Doczy et al. |

FOREIGN PATENT DOCUMENTS

| | | |
|---|---|---|
| JP | 56073469 | 6/1981 |
| JP | 57048268 | 3/1982 |
| JP | 57198658 | 12/1982 |
| JP | 58035976 | 3/1983 |
| JP | 59079573 | 5/1984 |

OTHER PUBLICATIONS

"Front End Processes," International Technology Roadmap for Semiconductor (ITRS), 2002 Update, pp. 45-62, http://member.itrs.net/.
"Front End Processes," International Technology Roadmap for Semiconductor (ITRS), 2003 Edition, pp. 23-25, http://member.itrs.net/.

(Continued)

*Primary Examiner*—Phat X Cao
*Assistant Examiner*—Nga Doan
(74) *Attorney, Agent, or Firm*—Slater & Matsil, L.L.P.

(57) ABSTRACT

A dielectric material layer is formed over a workpiece, a metal layer is formed over the dielectric material layer, and a semiconductive material layer is formed over the metal layer. The workpiece is heated, causing a top portion of the metal layer to interact with the semiconductive material layer and causing a bottom portion of the metal layer to diffuse into the dielectric material layer. The metal layer portion that interacts with the semiconductive material layer forms a silicide, and the diffused metal layer portion forms a high dielectric constant gate material having a graded concentration of the metal from the metal layer. At least the semiconductive material layer and the dielectric material layer are patterned to form a gate and a gate dielectric of a transistor device. A source region and a drain region are formed in the workpiece proximate the gate and gate dielectric.

14 Claims, 4 Drawing Sheets

OTHER PUBLICATIONS

Kim, H., et al., "Nano-Scale Zirconia and Hafnia Dielectrics Grown by Atomic Layer Deposition: Crystallinity, Interface Structures and Electrical Properties," ERC Teleseminar, May 6, 2004, pp. 1, 22-26.

Murarka, S.P., "Silicides for VLSI Applications," 1983, pp. 30, 67-68, Academic Press, New York, NY, US.

* cited by examiner

SEMICONDUCTOR DEVICE AND METHOD OF MANUFACTURE THEREOF

This application is a divisional of patent application Ser. No. 11/005,385, entitled "Semiconductor Device and Method of Manufacture Thereof," filed on Dec. 6, 2004, now U.S. Pat. No. 7,291,526 which application is incorporated herein by reference.

TECHNICAL FIELD

The present invention relates generally to semiconductor devices, and more particularly to structures and methods of manufacturing transistor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complimentary MOS (CMOS) devices, use both positive and negative channel devices in complimentary configurations. While this requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide for a gate dielectric becomes a problem because of gate leakage current, which can degrade device performance.

To fully realize the benefits of transistor scaling, the gate oxide thickness needs to be scaled down to less than 2 nm. However, the resulting gate leakage current makes the use of such thin oxides impractical in many device applications where low standby power consumption is required. For this reason, there is a trend in the industry towards the development of the use of high dielectric constant (k) materials for use as the gate dielectric in MOSFET devices. The term "high k materials" as used herein refers to a dielectric material having a dielectric constant of greater than about 7.8.

High k gate dielectric development has been identified as one of the future challenges in the 2002 edition of International Technology Roadmap for Semiconductors (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling.

However, one problem with using high k materials as gate dielectrics is lower mobility, which is undesirable. The performance of devices with high k dielectric materials tends to suffer from trapped charge in the dielectric layer, which deteriorates the mobility, making the drive current lower than in transistors having silicon dioxide gate oxides, thus reducing the speed and performance of transistors having high k gate dielectric materials.

Another problem with using high k materials as a gate dielectric is that if polysilicon is used as a gate material, which is the most common type of gate material currently used, in conjunction with a high k gate dielectric, polysilicon (poly) depletion can occur between the gate dielectric and the gate. When a CMOS device is operated in an inversion mode, poly depletion causes an increase in the electrical equivalent gate oxide thickness, e.g., by about 4 to 5 Angstroms. It is desirable for the gate capacitance to be relatively high for increased gate control. However, poly depletion decreases the capacitance and lowers the drive current of the CMOS device, which is undesirable.

What is needed in the art is a transistor design that does not exhibit the poly depletion effect, and that has low leakage current and high mobility.

SUMMARY OF THE INVENTION

These and other problems are generally solved or circumvented, and technical advantages are generally achieved, by preferred embodiments of the present invention, which provide a novel transistor design and method of manufacture thereof. A first dielectric material layer is formed over a workpiece. The first dielectric material layer comprises a material that is traditionally used as a gate dielectric material, such as silicon oxide or silicon oxynitride. A metal layer is deposited over the first dielectric material layer, and a semiconductive material layer is deposited over the metal layer. The device is thermally treated to form a silicided gate electrode by upward movement of molecules from the metal layer, and to diffuse the metal downwards into at least a portion of the first dielectric material, forming a second dielectric material layer with a higher dielectric constant than the first dielectric material layer.

In accordance with a preferred embodiment of the present invention, a method of manufacturing a transistor includes providing a workpiece, forming a dielectric material layer over the workpiece, forming a metal layer over the dielectric material layer, and forming a semiconductive material layer over the metal layer. The workpiece is heated, causing a top portion of the metal layer to interact with the semiconductive material layer and causing a bottom portion of the metal layer to diffuse into the dielectric material layer. At least the semiconductive material layer and the dielectric material layer are patterned, forming a gate and a gate dielectric. A source region and a drain region are formed in the workpiece proximate the gate and gate dielectric.

In accordance with another preferred embodiment of the present invention, a method of manufacturing a transistor includes providing a workpiece, forming a first dielectric material layer over the workpiece, forming a metal layer over the dielectric material layer, and forming a silicon layer over the metal layer. The workpiece is heated, causing a top portion of the metal layer to interact with at least a portion of the silicon layer, forming a first silicide, and causing a bottom portion of the metal layer to diffuse into the first dielectric material layer, forming a second dielectric material layer. At least the first silicide and the second dielectric material layer are patterned, forming a gate and a gate dielectric. A source region and a drain region are formed in the workpiece proximate the gate and gate dielectric.

In accordance with another preferred embodiment of the present invention, a transistor device includes a workpiece, and a first gate dielectric disposed over the workpiece, the first gate dielectric comprising a graded concentration of a metal. A gate is disposed over and abutting the first gate dielectric, the gate comprising a combined layer of a semiconductive material and the metal, wherein the first gate dielectric comprises a first concentration of the metal proximate the workpiece and a second concentration of the metal proximate the gate, wherein the second concentration is greater than the first concentration.

Advantages of embodiments of the invention include decreasing the electrical equivalent gate oxide thickness of a transistor device by diffusing metal into the gate dielectric. The metal diffused into the gate dielectric creates a higher dielectric constant gate dielectric material, avoiding leakage current problems. Furthermore, the poly depletion effect is avoided, because the polysilicon layer of the gate is separated from the gate dielectric by the metal layer and diffused metal gate dielectric region.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
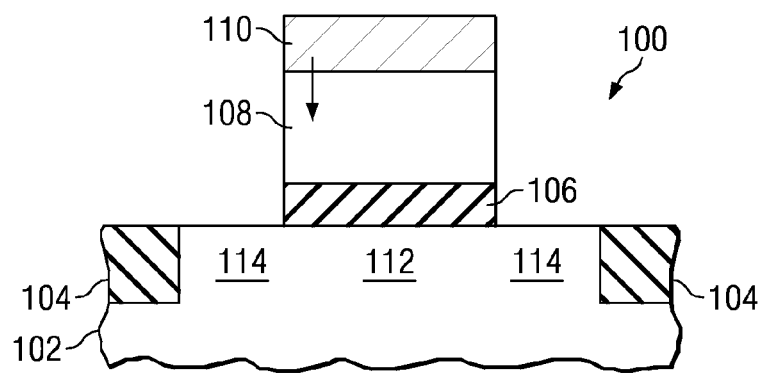
FIGS. 1 and 2 show cross-sectional views of a prior art method of forming a fully silicided (FUSI) gate electrode, which is not always effective in full silicidation of the gate and is difficult to integrate into manufacturing processes.

A prior art method of forming a fully silicided polysilicon (FUSI) gate will be described with reference to FIG. 1. The semiconductor device 100 includes a workpiece 102 that may have isolation regions 104 formed therein. A gate dielectric 106 is formed over a channel region 112 that is disposed between source and drain regions 114. A polysilicon layer 108 is formed over the gate dielectric 106, as shown. A metal layer 110 is deposited over the polysilicon layer 108. Common metals used to form silicides include Co or Ni, as examples.

Figure 2:
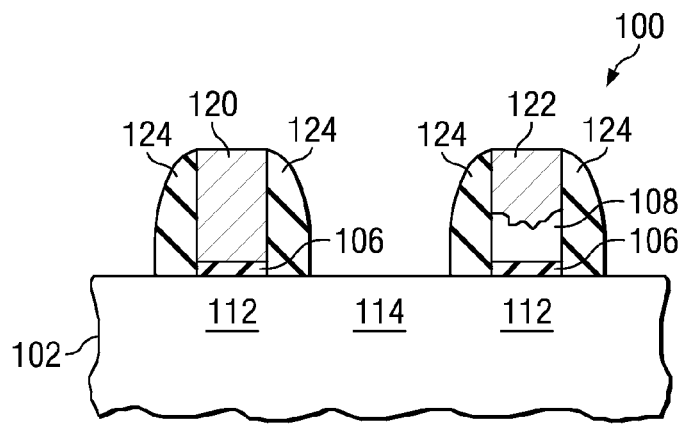

The workpiece 102 is thermally treated, e.g., heated or annealed, to cause the metal 110 to react with the polysilicon 108 and form a silicide 120, as shown in the left side of FIG. 2. The metal in the metal layer 110 moves from the top downwards toward the polysilicon 108. Dopants are typically implanted in the source and drain regions 114, and then insulating spacers 124 are typically formed over the sidewalls of transistor gates, for example.

A problem with prior art FUSI methods is incomplete silicidation of the polysilicon, as shown in the right side of FIG. 2. While the transistor on the left has a fully silicided gate 120, the transistor on the right has a partially silicided region 122 and a portion of the polysilicon 108 left remaining that is not silicided.

Partial silicidation 122 may be caused by several problems in the manufacturing process. The thickness of the polysilicon 108 layer formed over a workpiece 102 may not be uniform across the surface of the workpiece 102. The thickness of the metal 110 layer also may not be uniform. During the thermal treatment to form the silicide, the temperature of the workpiece 102 may not be uniform across the surface of the workpiece 102.

Uniform material layers and processing parameters are needed to form FUSI gates across the entire surface of a workpiece 102. If some transistors have fully silicided gates and others have partially silicided gates, the semiconductor device 100 performance may be degraded, or the device 100 may not be functional at all. For example, in CMOS devices, a symmetric $V_{tp}$ and $V_{tn}$ of the PMOS and NMOS transistors is desired to achieve a symmetric work function. In electronics, the "work function" is the energy (usually measured in electron volts) needed to remove an electron from the Fermi level to a point an infinite distance away outside the surface. Work function is a material property of any material, whether the material is a conductor, semiconductor, or dielectric. The work function of a semiconductor or conductor directly affects the threshold voltage of a transistor when the material is used as a gate electrode. If one of the transistors is not fully silicided and the other is, the work function of the CMOS device is asymmetric, and the CMOS device is not functional and must be discarded.

Because partial silicidation 122 is a prevalent problem in the semiconductor industry, FUSI is not currently widely used in production processes. The process window for prior art FUSI processes is very narrow, and prior art FUSI processes are difficult to integrate and implement into manufacturing processes. Thus, what is needed in the art is a dependable method of forming fully silicided gates that is predictable, integratable, and has a larger process window, that can be used in production.

The present invention will be described with respect to preferred embodiments in specific contexts, namely, n channel metal oxide semiconductor (NMOS) or p channel metal oxide semiconductor (PMOS) transistors, and CMOS devices. Embodiments of the present invention may also be applied, however, to other semiconductor device applications where one or more transistors are required. Note that in some of the drawings, only one or two transistors are shown; however, there may be many transistors formed during each of the manufacturing processes described herein.

Embodiments of the present invention achieve technical advantages by providing a backside silicide process that advantageously simultaneously forms a high k dielectric gate material beneath the silicide. Rather than forming the silicide in a top-down process, as shown in the prior art process with reference to FIGS. 1 and 2, the novel silicide is formed in a bottom-up process, to be described further herein.

Figure 3:
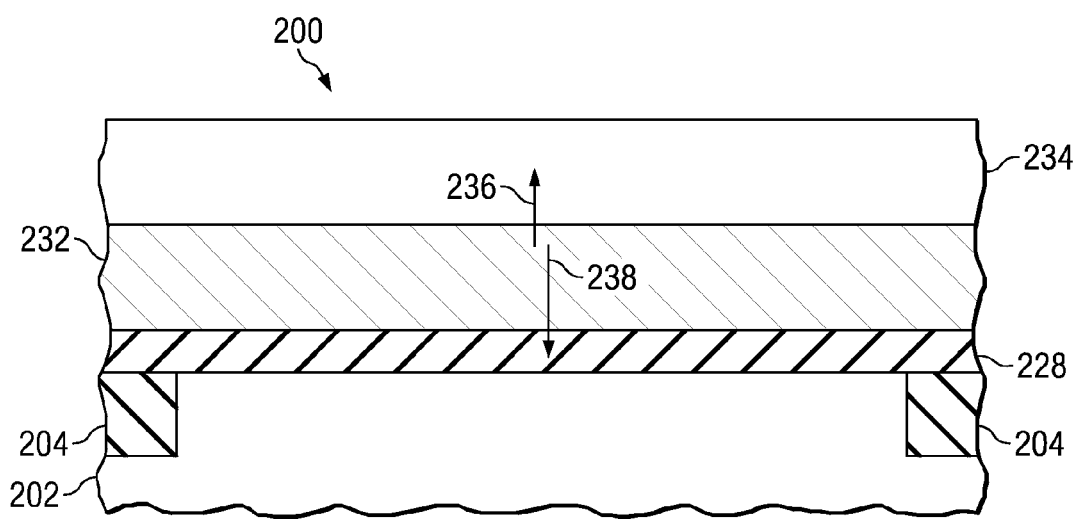
FIGS. 3 and 4 show cross-sectional views of a preferred embodiment of the present invention, wherein when the workpiece is heated, metal from a metal layer interacts with an overlying semiconductive material layer to form a silicide and also diffuses downward into a gate dielectric material, increasing the dielectric constant.

FIG. 3 shows a cross-sectional view of a semiconductor device 200 that illustrates an embodiment of the present invention. First, a workpiece 202 is provided. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate.

The workpiece 202 may include optional shallow trench isolation (STI) regions 204 formed in the workpiece 202, as shown. The workpiece 202 may be doped with P or N type dopants, depending on whether the junctions of the transistor to be formed will be P or N type, e.g., whether the device 200 will comprise a PMOS or NMOS transistor, respectively.

In accordance with embodiments of the present invention, a first dielectric material layer 228 is formed over the workpiece 202. Preferably, the first dielectric material layer 228 comprises silicon oxide, e.g., $SiO_2$ or $SiO_x$. Alternatively, the first dielectric material layer 228 may comprise silicon oxynitride ($SiO_xN_y$), as an example, although the first dielectric material layer 228 may also comprise other insulating materials. Preferably, the first dielectric material layer 228 comprises a dielectric constant of about 3.5 to about 7.8, in one embodiment. For example, $SiO_2$ typically comprises a dielectric constant of about 3.9, and SiON typically comprises a dielectric constant of about 7.8.

The first dielectric material layer 228 preferably comprises a thickness of about 5 to 50 Å, as examples, although alternatively, the first dielectric material layer 228 may comprise other dimensions. The first dielectric material layer 228 may be formed by chemical vapor deposition (CVD), atomic layer deposition (ALD), metal organic chemical vapor deposition (MOCVD), physical vapor deposition (PVD), or jet vapor deposition (JVD), as examples, although alternatively, the first dielectric material layer 228 may be deposited using other suitable deposition techniques. The first dielectric material layer 228 is preferably formed directly over and abutting the top surface of the workpiece 202.

A metal layer 232 is formed over the first dielectric material layer 228. The metal layer 232 preferably comprises a layer of Hf, Zr, Ta, Ti, La, Al, Ni, Co, Mo, W, Pt, combinations thereof, or one or more layers (e.g., a plurality of stacks) thereof, as examples, although alternatively, the metal layer 232 may comprise other metals. The metal layer 232 preferably comprises a thickness of about 5 Å to 500 Å, as examples, although alternatively, the metal layer 232 may comprise other dimensions. The metal layer 232 may be formed using CVD, PVD, or ALD, as examples, although alternatively, the metal layer 232 may be deposited using other deposition techniques.

A semiconductive material layer 234 is formed over the metal layer 232, as shown. The semiconductive material layer 234 preferably comprises polysilicon, although alternatively, the semiconductive material layer 234 may comprise amorphous silicon or other semiconductor materials, as examples. The semiconductive material layer 234 preferably comprises a thickness of about 100 Å to 5000 Å, as examples, although alternatively, the semiconductive material layer 234 may comprise other dimensions, such as between about 1000 Å to 2000 Å, in some embodiments. The semiconductive material layer 234 may be formed by CVD or PVD, as examples, although alternatively, the semiconductive material layer 234 may be deposited using other deposition techniques.

Preferably, the first dielectric material layer 228, the metal layer 232, and the semiconductive material layer 234 are formed on the workpiece 202 in a vacuum, and more preferably, the vacuum is not broken between the formation of these material layers.

The workpiece 202 is thermally treated, e.g., at a temperature of about 750 degrees C. for about 15 minutes, although alternatively, other temperatures and time periods may be used. The workpiece 202 may be heated at about 650 to about 850 degrees C. for about 5 to 30 minutes in one embodiment, for example. The thermal treatment causes upward movement 236 of the metal molecules of the metal layer 232 and also causes downward movement 238 of the metal molecules of the metal layer 232.

Figure 4:
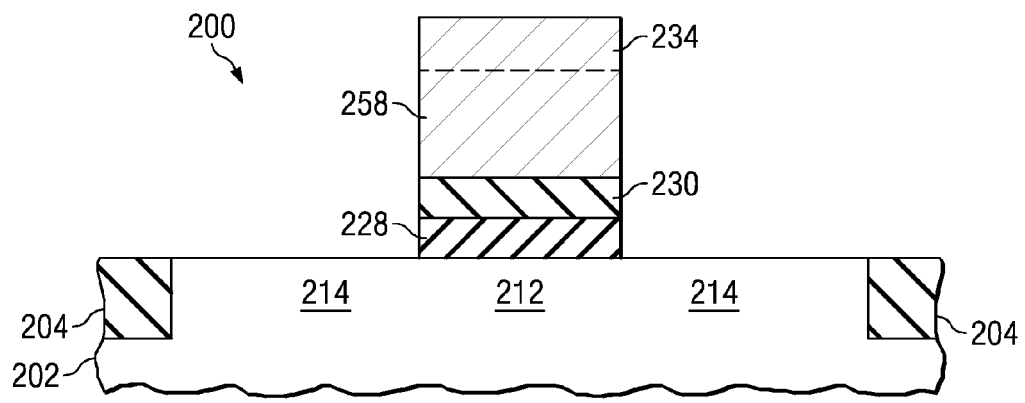

The upward movement 236 of the metal layer 232 molecules caused by the thermal treatment causes a top portion of the metal layer 232 to react with the semiconductive material layer 234 and form a combined layer 258 of the semiconductive material of the semiconductive material layer 234 and the metal of the metal layer 232, as shown in FIG. 4. For example, if the semiconductive material layer 234 comprises silicon, a silicide 258 is formed. In one embodiment, for example, if the metal layer 232 comprises Hf and the semiconductive material layer 234 comprises polysilicon, the combined layer 258 comprises hafnium silicide ($HfSi_x$). The metal layer 232 comprises Hf in a preferred embodiment, because the resulting $HfSi_x$ combined layer 258 has a low resistivity, e.g., about 45 to 50 μΩ/cm, for example.

In one embodiment, the metal layer 232 fully silicides the semiconductive material layer 234 to form a fully silicided combined layer 258. In another embodiment, the metal layer 232 partially silicides the semiconductive material layer 234, leaving a portion of non-silicided semiconductive material layer 234 disposed above the combined layer 258, as shown in phantom in FIG. 4. The metal profile within the silicided combined layer 258 may be graded, e.g., the metal may have a higher concentration at the bottom of the combined layer 258 than at the top.

The thermal treatment also simultaneously causes a bottom portion of the metal layer 232 to diffuse in a downward direction 238 into the first dielectric material layer 228, forming a region of diffused metal from the metal layer within the first dielectric material layer 228. The region of diffused metal within the first dielectric material layer 228 forms a second dielectric material layer 230, shown in FIG. 4. The second dielectric material layer 230 comprises an insulating material that is a different material than the first dielectric material layer 228. For example, if the metal layer 232 comprises Hf and the first dielectric material layer 228 comprises $SiO_2$, the second dielectric material layer 230 comprises hafnium silicate ($HfSiO_x$). As another example, if the metal layer 232 comprises Hf and the first dielectric material layer 228 comprise $SiO_xN_y$, the second dielectric material layer 230 preferably comprises $HfSiO_xN_y$. The second dielectric material layer 230 preferably comprises HfSiO, HfSiON, ZrSiO, ZrSiON, TaSiO, TaSiON, LaSiO, LaSiON, AlSiO, AlSiON, TiSiO, TiSiON, NiSiO, NiSiON, CoSiO, CoSiON, MoSiO, MoSiON, WSiO, WSiON, PtSiO, PtSiON, or combinations thereof, as examples, although alternatively, the second dielectric material layer 230 may comprise other materials. If the first dielectric material layer 228 comprises $SiO_x$, the second dielectric material layer 230 comprises $MSiO_x$, where "M" comprises a metal or metals of the metal layer 232, for example. Likewise, if the first dielectric material comprises $SiO_xN_y$, the second dielectric material layer 230 comprises $MSiO_xN_y$.

The second dielectric material layer 230 preferably comprises a higher dielectric constant than the dielectric constant of the first dielectric material layer 230, in one embodiment. For example, the second dielectric material layer 230 preferably comprises a dielectric constant of about 7.8 or greater. The first dielectric material layer 228 preferably comprises a first dielectric constant, and the second dielectric material layer 230 preferably comprises a second dielectric constant, wherein the second dielectric constant is greater than the first dielectric constant. The diffusion of the bottom portion of the metal layer 232 into the first dielectric material layer 228 causes an increase in the dielectric constant by the introduction of the metal atoms from the metal layer 232, and forms the second dielectric material layer 230 having the second dielectric constant, for example.

Because the metal layer 232 diffuses into the first dielectric material layer 228, the profile of the metal diffused into the first dielectric material layer 228 is of a Gaussian type. Thus, there is a higher concentration of metal from the metal layer 232 within the second dielectric material layer 230 proximate the combined layer 258 of the semiconductive material and the metal, and there is a lower concentration of metal from the metal layer 232 within the second dielectric material layer 230 proximate the first dielectric material layer 228, for example. The concentration of the metal from the metal layer 232 may be about 5 times higher proximate the combined layer 258 than the concentration of the metal from the metal layer 232 proximate the first dielectric material layer 232 or workpiece 202, with a Gaussian distribution of the metal concentration in the remainder of the thickness of the second dielectric material layer 230 between the high and low concentration regions, for example.

Preferably, in accordance with one embodiment of the present invention, a portion of the first dielectric material layer 228 is not diffused with the metal from the metal layer 232, but remains disposed beneath the second dielectric material layer 230, as shown in FIG. 4. In this embodiment, the initial thickness of the first dielectric material layer 228 may be reduced by about 1 to about 40 Å. Also, in this embodiment, the metal from the metal layer 232 preferably diffuses into the first dielectric material layer 228 by about 10 to 80% of the thickness of the first gate dielectric material 228 to form the second dielectric material layer 230.

However, in another embodiment of the present invention, the entire thickness of the first dielectric material layer 228 is diffused with the metal from the metal layer 232, so that the first dielectric material layer 228 no longer resides beneath the second dielectric material layer 230 (not shown in the Figures). In this embodiment, the metal from the metal layer 232 diffuses into the first dielectric material layer 228 by about 10 to 100% of the thickness of the first dielectric material layer 228 to form the second dielectric material layer 230.

After the heat treatment, in one embodiment, preferably all of the metal layer 232 has either interacted with the semiconductive material layer 234 or has diffused into the first dielectric material layer 228. However, in another embodiment, a portion of the metal layer 232 remains. This remaining portion of the metal layer 232 is preferably completely utilized in a later processing step for the semiconductor device 200, e.g., in a thermal anneal to form the source and drain regions, which may comprise temperatures of greater than 750 degrees C., e.g., about 1000 degrees C., for example. Thus, preferably the metal layer 232 does not remain in the cross-section of the finished semiconductor device 200, for example.

The material layers 234, 232, 230, and 228 are patterned and etched to form a gate electrode and gate dielectric of a transistor, as shown in FIG. 4. The manufacturing process is then continued to complete the device 200. For example, the source and drain regions 214 may be implanted with dopants, and the workpiece 202 may be annealed to form implantation regions. The second dielectric material layer 230, or the second dielectric material layer 230 and the first dielectric material layer 228, function as the gate dielectric of the transistor. The combined layer 258 (e.g., comprising a silicide), or the combined layer 258 and the non-silicided portion of the semiconductive material layer 258, function as the gate electrode. The top surface of the source and drain regions 214 and the top surface of the optional semiconductive material 234 may be silicided by forming a metal and heat treating the workpiece 202 to form a silicide (not shown in FIG. 4; see FIGS. 9 and 10.)

Thus, a novel FUSI method and structure is provided, wherein a metal layer 232 is deposited or formed before the semiconductive material layer 232 to be silicided is deposited. The silicide process occurs from the bottom to the top of the gate material stack, rather than from the top to the bottom, as in prior art FUSI processes. Because the silicidation process occurs from the bottom of the gate electrode upwards, the process control is simplified, and there is no patterning dependence on the silicidation process. Furthermore, it is not necessary to fully silicide the entire thickness of the semiconductive material layer 232, because the combined layer 230 comprising the silicide is adjacent the gate dielectric 230.

Because the high k dielectric material formed (e.g., second dielectric material layer 230) has a graded, Gaussian profile of the metal from the metal layer 232, the lower portion of the second dielectric material layer 230 has less content of the metal, which is favorable to mobility improvement. Because the high k dielectric material 230 is formed from the metal layer 232, impurity contamination in the high k dielectric material 230 from pre-cursors are avoided, which can result if high k dielectric materials are deposited by CVD or ALD processes.

FIGS. 5 through 8 show cross-sectional views of a method of forming a CMOS device at various stages of manufacturing in accordance with another preferred embodiment of the present invention. Like numerals are used for the various elements that were described in FIGS. 3 and 4. To avoid repetition, each reference number shown in FIGS. 3 and 4 is not described again in detail herein. Rather, similar materials x02, x04, ... x28, x32, x34, etc. ... are preferably used for the various material layers shown as were described for FIGS. 3 and 4, where x=2 in FIGS. 3 and 4 and x=3 in FIGS. 5 through 8. As an example, the preferred and alternative materials and dimensions described for the first dielectric material layer 228 and the metal layer 232 in the description for FIGS. 3 and 4 are preferably also used for the first dielectric material layer 328 and the metal layer 332 of FIGS. 5 through 8.

Figure 5:
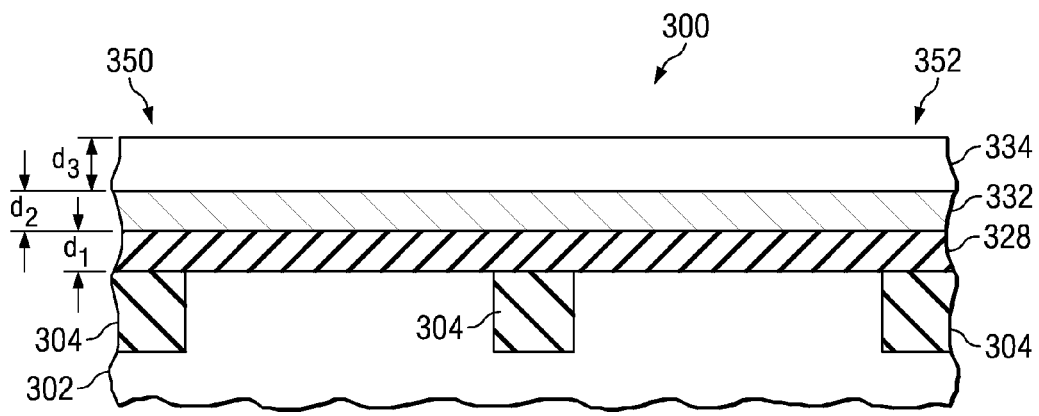
FIGS. 5 through 8 show cross-sectional views of a method of forming a CMOS device at various stages of manufacturing in accordance with another preferred embodiment of the present invention, wherein the interaction between the metal layer and the semiconductive material layer forms a fully silicided gate.
Figure 8:
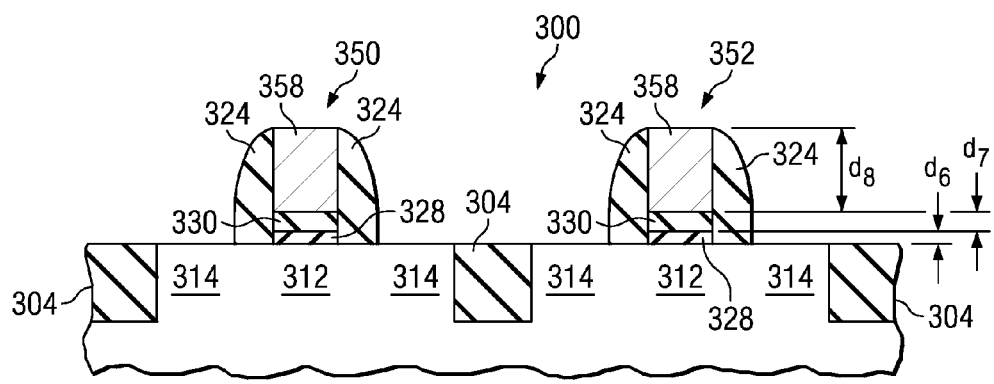

In this embodiment, the interaction between the metal layer 332 and the semiconductive material layer 334 (see FIG. 5) forms a fully silicided gate 358 (see FIG. 8). Referring first to FIG. 5, as in the previously described embodiment, a first dielectric material layer 328 is formed over a workpiece 302, a metal layer 332 is formed over the first dielectric material layer 328, and a semiconductive material layer 334 is formed over the metal layer 332. The first dielectric material layer 328 preferably comprises an initial thickness $d_1$, the metal layer 332 comprises an initial thickness $d_2$, and the semiconductive material layer 334 comprises an initial thickness $d_3$, as shown. The workpiece includes a region 350 where a PMOS transistor will be formed, and a region 352 where an NMOS transistor will be formed.

Figure 6:
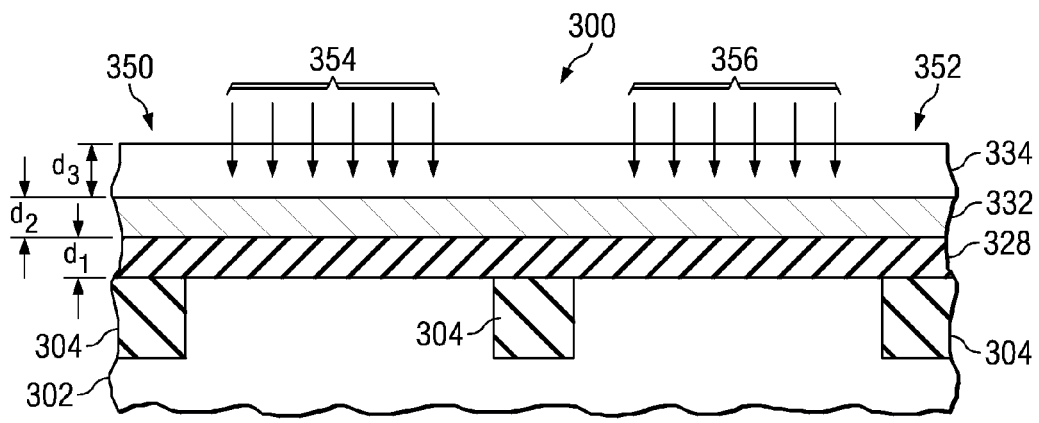

The semiconductive material layer 334 may be implanted with dopants 354 and 356, as shown in FIG. 6. For example, the NMOS transistor region 352 may be masked while the PMOS transistor region 350 is implanted with P type dopants 354, and the PMOS transistor region 350 may be masked while the NMOS transistor region 352 is implanted with N type dopants 356. (The masking levels are not shown in FIG. 6.) The work function of the PMOS and NMOS transistors 350 and 352 may tuned by the implantation of the dopants 354 and 356, for example.

Figure 7:
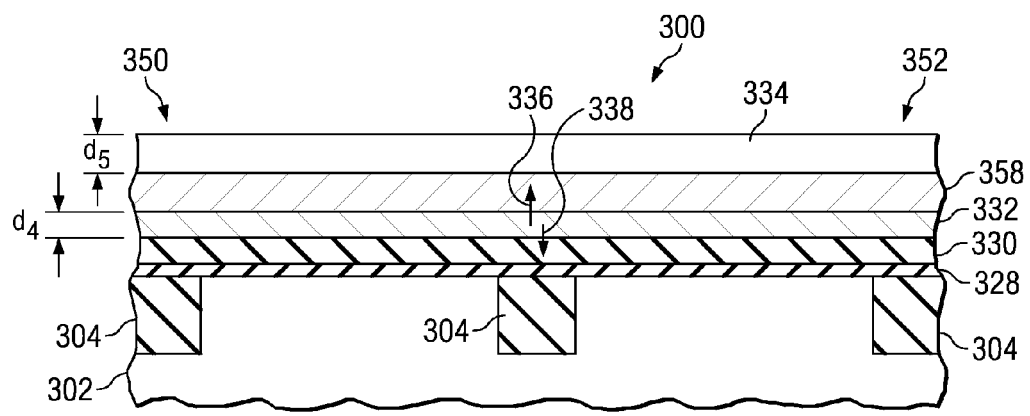

The semiconductor device 300 is subjected to a heat treatment, as shown in FIG. 7. A cross-sectional view of the workpiece 302 and various material layers is shown after at least a portion of the heat treatment has been completed. A portion of the metal layer 332 has diffused in a downward direction 338 to form a second dielectric material layer 330 within the first dielectric material layer 328. The second dielectric material layer 330 comprises a higher dielectric constant than the first dielectric material layer 328, and comprises the metal of the metal layer 332. A portion of the metal layer 332 has moved in an upward direction 336 to interact with the semiconductive material layer 334 bottom surface, forming a combined layer 358 between the metal layer 332 and the semiconductive material layer 334, as shown. A portion of the metal layer 332 still resides in the structure at this stage of the manufacturing process, having a thickness $d_4$, which is less than the initial thickness $d_2$ of the metal layer, shown in FIGS. 5 and 6. The thickness $d_5$ of the unreacted semiconductive material layer 334 has been decreased from the initial thickness $d_3$ shown in FIGS. 5 and 6, as a portion of the metal layer 332 has reacted with the bottom portion of the semiconductive material layer 334 to form the combined layer 358 of the semiconductive material and the metal.

The thermal treatment may be continued to completely react the semiconductive material layer 334 and form a fully silicided gate material, e.g., combined layer 358, as shown in FIG. 8. The combined layer 358, second dielectric material layer 330 and first dielectric material layer 328 are then patterned and etched, e.g., using lithography techniques, forming a gate electrode and gate dielectric of the PMOS and NMOS transistors 350 and 352. The source and drain regions may be implanted with dopants and thermally annealed, and insulating spacers 324 may be formed over the gate electrode and gate dielectric of the PMOS and NMOS transistors 350 and 352, as shown. In one embodiment, the thermal treatment is stopped at the point shown in FIG. 7, where a portion of the metal layer 330 still resides in the structure. Preferably, in this embodiment, subsequent thermal processing completes the interaction and diffusion of molecules from the metal layer 332 with adjacent layer 328 and 334, forming a fully silicided transistor gate electrode 358, as shown in FIG. 8.

The final thickness $d_6$ of the first dielectric material layer 328 is less than the initial thickness $d_1$ of the first dielectric material layer 328. There may be no first dielectric material layer 328 left remaining in the structure, in one embodiment (e.g., thickness $d_6$ may be zero). The final thickness $d_7$ of the second dielectric material layer 330 is preferably less than or equal to the initial thickness $d_1$ of the first dielectric material layer 328, for example. The final thickness $d_8$ of the combined layer 358 of the semiconductive material and the metal, which preferably comprises a silicide or a more conductive form of the semiconductive material of the semiconductive material layer 334 of FIG. 6, is preferably at least as thick as the initial thickness $d_3$ of the semiconductive material layer 334, in this embodiment, for example.

Figure 9:
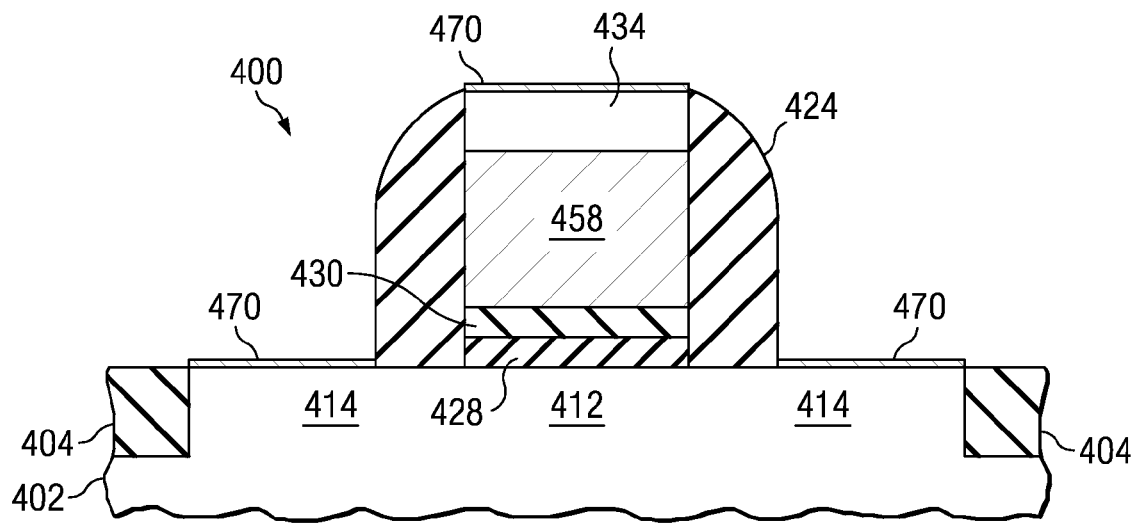
FIGS. 9 and 10 show cross-sectional views of a method of forming a transistor device at various stages of manufacturing in accordance with another preferred embodiment of the present invention, wherein the semiconductive material layer is partially silicided from the bottom by a first heating step, and then silicided again from the top in a second heating step.
Figure 10:
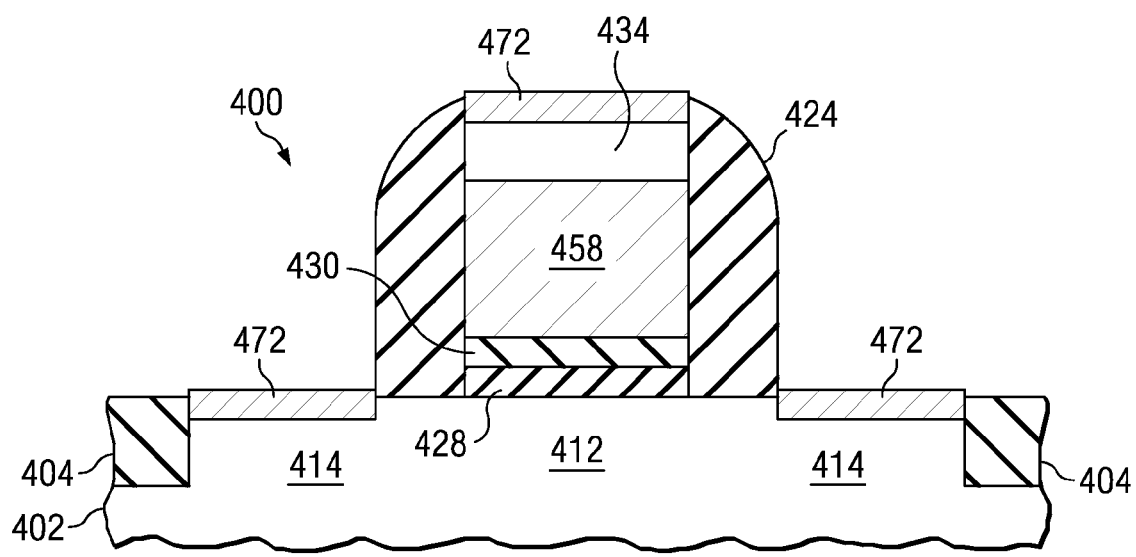

FIGS. 9 and 10 show cross-sectional views of a method of forming a transistor device at various stages of manufacturing in accordance with another preferred embodiment of the present invention, wherein the semiconductive material layer 434 is partially silicided (e.g., at combined layer 458) from the bottom up by a first heating step, and then the semiconductive material layer 434 is silicided again from the top down in a second heating step, after the source and drain regions are formed in the workpiece. Again, like numerals are used for the various elements that were described in the previous figures, and to avoid repetition, each reference number shown and described with respect to the previous figures is not described again in detail herein. Rather, similar materials x02, x04, ... x28, x32, x34, etc. ... are preferably used for the various material layers shown as were described for FIGS. 3 and 4, and 5 through 8, where x=2 in FIGS. 3 and 4, x=3 in FIGS. 5 through 8, and x=4 in FIGS. 9 and 10.

After the first heating step, (e.g., by a first metal layer such as metal layer 332 as shown in FIG. 6: the first metal layer is not shown in FIGS. 9 and 10) a second metal layer 470 is formed on the top surface of the non-silicided semiconductive material layer 434, as shown in FIG. 9. The second metal layer 470 may comprise a metal such as Co, Ni, Ti, other metals, or combinations thereof, as examples, although alternatively, the second metal layer 470 may comprise other materials. The second metal layer 470 may also be formed on the top surface of the source and drain regions 414, as shown. The workpiece 402 is then heated in a second heating step to form a silicide 472 at the top surface of the semiconductive material layer 472, and also, optionally, at the top surface of the source and drain regions 414, as shown in FIG. 10. Siliciding the top surface of the semiconductive material layer 434 and/or source and drain regions 414 is advantageous because the silicide 472 provides a good conductive material to make contact to, e.g., by contacts that may be formed through subsequently deposited insulating layers, to make electrical contact to the semiconductor device 400. For example, after the manufacturing processes described herein, one or more insulating materials (not shown) may be deposited over the transistors, and contacts may be formed in the insulating materials in order to make electrical contact with the gates, sources and/or drains.

Referring again to FIGS. 5 through 8, in one embodiment, the manufacturing processes of doping the semiconductive material layer 334, gate and gate dielectric patterning, and the source and drain implantation may be performed before the first heating step or thermal treatment to cause migration of the metal layer molecules into the adjacent material layers 328 and 334, for example.

Additional metallization and insulating layers may be formed and patterned over the top surface of the insulating material and contacts. A passivation layer (not shown) may be deposited over the insulating layers, bond pads (also not shown) may be formed over contacts, and the semiconductor devices 200, 300, and 400 may then be singulated or separated into individual die. The bond pads may be connected to leads of an integrated circuit package (not shown) or other die, for example, in order to provide electrical contact to the transistors of the semiconductor devices 200, 300, and 400.

Other optional elements that may be included in the semiconductor devices 200, 300, and 400 described herein. For example, before forming spacers over the sidewalls of the gate dielectric and gates, an optional thin insulator may be formed over the top surface of the sources and drains, and the sidewalls of the gate dielectrics, silicon layers, and gates (not shown.) The spacers are then formed over the thin insulator. The thin insulator may comprise an oxide, and the spacers may comprise a nitride, although alternatively, other materials may be used for the thin insulator and the spacers, for example. The sources and drains of the transistors may include lightly doped areas and deeper implantation regions, not shown.

Advantages of embodiments of the invention include decreasing the electrical equivalent gate oxide thickness of a transistor device by diffusing metal into the gate dielectric. The metal diffused into the gate dielectric creates a higher dielectric constant gate dielectric material, avoiding leakage current problems. A method of uniformly fully siliciding a gate of a transistor across the surface of a workpiece is achieved that is effective, reproduceable, and has an increased process window in semiconductor manufacturing production lines. Furthermore, poly depletion is avoided, because the polysilicon layer of the gate is separated from the gate dielectric by the metal layer and diffused metal gate dielectric region. In a CMOS device, the PMOS transistor and the NMOS transistor can be tuned to have a substantially symmetric $V_t$ by implanting the polysilicon with P and N type dopants, respectively. For example, $V_{tn}$ may be about +0.2 to +5 V, and $V_{tp}$ may be the substantially the same negative value, e.g., about −0.2 to −5 V. The threshold voltages $V_t$ may alternatively comprise other voltage levels, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor device, comprising:
   a workpiece;
   a first gate dielectric disposed over the workpiece, the first gate dielectric having a bottom surface facing towards said workpiece and comprising a graded concentration of a metal, said graded concentration of a metal comprising metal molecules that migrate from an abutting layer of a selected metal;
   a gate disposed over the top surface of said first gate dielectric, the gate comprising a combined layer of a semiconductive material and molecules of metal that diffuse from said layer of a selected metal;
   the layer of selected metal abutting said first gate dielectric and providing said molecules that migrate to said first gate dielectric and that diffuse into said semiconductor material; and
   wherein the first gate dielectric comprises a first concentration of the metal proximate the bottom surface of the gate dielectric and a second concentration of the metal proximate the gate, wherein the second concentration is greater than the first concentration.

2. The transistor device according to claim 1, wherein the first gate dielectric comprises a first dielectric constant, further comprising a second gate dielectric disposed between the workpiece and the first gate dielectric, the second gate dielectric comprising a second dielectric constant, wherein the second dielectric constant is less than the first dielectric constant.

3. The transistor device according to claim 2, wherein the first dielectric constant comprises a dielectric constant of about 7.8 or greater, and wherein the second dielectric constant comprises a dielectric constant of about 3.5 to about 7.8.

4. The transistor device according to claim 3, wherein the second gate dielectric comprises SiOx or SiOxNy.

5. The transistor device according to claim 2, wherein the gate further comprises a layer of the semiconductive material disposed over and abutting the combined layer of the semiconductive material and the metal.

6. The transistor device according to claim 1, wherein the combined layer of the semiconductive material and the metal comprises a first combined layer, wherein the gate further comprises a second combined layer of the semiconductive material and a metal disposed over and abutting the layer of the semiconductive material.

7. The transistor device, according to claim 2, wherein the metal comprises. Hf, Zr, Ta, Ti, La, Al, Ni, Co, Mo, W, Pt, combinations thereof, or one or more layers thereof, and wherein the semiconductive material comprises silicon.

8. The transistor device according to claim 1, wherein all of the metal molecules of said layer of the metal layer migrate and diffuse into said gate dielectric and said semiconductor material respectively.

9. The transistor device according to claim 8, wherein the first gate dielectric comprises a first dielectric constant, further comprising a second gate dielectric disposed between the workpiece and the first gate dielectric, the second gate dielectric comprising a second dielectric constant, wherein the second dielectric constant is less than the first dielectric constant.

10. The transistor device according to claim 9, wherein the first dielectric constant comprises a dielectric constant of about 7.8 or greater, and wherein the second dielectric constant comprises a dielectric constant of about 3.5 to about 7.8.

11. The transistor device according to claim 10, wherein the second gate dielectric comprises SiOx or SiOxNy.

12. The transistor device according to claim 9, wherein the gate further comprises a layer of the semiconductive material disposed over and abutting the combined layer of the semiconductive material and the metal.

13. The transistor device according to claim 8, wherein the combined layer of the semiconductive material and the metal comprises a first combined layer, wherein the gate further comprises a second combined layer of the semiconductive material and a metal disposed over and abutting the layer of the semiconductive material.

14. The transistor device according to claim 8, wherein the metal comprises Hf, Zr, Ta, Ti, La, Al, Ni, Co, Mo, W, Pt, combinations thereof or one or more layers thereof, and wherein the semiconductive material comprises silicon.

\* \* \* \* \*